United States Patent [19]
Lang et al.

[11] Patent Number: 5,623,193
[45] Date of Patent: Apr. 22, 1997

[54] APPARATUS FOR CONTROLLING BATTERY DISCHARGE

[75] Inventors: Gerhard Lang, Altweilnau; Jürgen Wolf, Kriftel, both of Germany

[73] Assignee: Braun Aktiengesellschaft, Kronberg, Germany

[21] Appl. No.: 592,076

[22] Filed: Jan. 26, 1996

Related U.S. Application Data

[63] Continuation of Ser. No. 211,011, Mar. 16, 1994, abandoned.

[30] Foreign Application Priority Data

Sep. 26, 1991 [DE] Germany .................. 41 31 981.8

[51] Int. Cl.$^6$ .................................................. H01M 10/48
[52] U.S. Cl. .................................................. 320/13; 320/54
[58] Field of Search .................. 320/13, 31, 39, 320/48, 54

[56] References Cited

U.S. PATENT DOCUMENTS 4,342,953   8/1982   Collins ........................ 320/13

Primary Examiner—Edward H. Tso
Attorney, Agent, or Firm—Fish & Richardson, P.C.

[57] ABSTRACT

The invention is directed to an electrical device in which an electrical load is powered by a battery via an electronic switching device. A display means serves the function of indicating the charge status of the battery, and a time measurement means determines the connection time of the load to the battery. Following expiration of a predetermined connection time of the load to the battery, when the display means indicates the charge status "zero", the time measurement means will disconnect the electrical load from the battery by means of the electronic switching device.

12 Claims, 3 Drawing Sheets

OUTPUT VOLTAGE OF PULSE-DURATION MODULATOR AT POINT (A)

REDUCTION OF MOTOR ROTATIONAL
FREQUENCY n AS A FUNCTION OF
PULSE DUTY FACTOR r AT POINT (B)

APPARATUS FOR CONTROLLING BATTERY DISCHARGE

This is a continuation of application Ser. No. 08/211,011, filed Mar. 16, 1994 now abandoned.

This invention relates to an electrical device with a battery, an electrical load powered by the battery via an electronic switching device, and a display means for indicating the charge status of the battery.

Battery-powered electrical devices, in particular consumer goods such as rechargeable shavers, are increasingly equipped with displays indicating the actual charge status of the battery or accumulator. For cost reasons, such charge status indicators usually operate on a time basis because such devices have an essentially constant power consumption (constant power), and the rated capacity of the battery is known.

For reasons of capacity changes of the battery and/or fluctuations in the power consumption of the device, it may happen that the display provides an incorrect information on the actual charge status of the battery. This is an inconvenience particularly towards the end of a discharge cycle when the battery is nearly depleted.

It is therefore an object of the present invention to improve the accuracy of the charge status indication of a battery-operated electrical device towards the end of the discharge cycle and to protect the battery against deep discharges.

In a device of the type initially referred to using a time measurement means determining the connection time of the load to the battery, this object is accomplished in that the time measurement means disconnects the electrical load from the battery by means of the electronic switching device following expiration of a set connection time of the load to the battery, when the display means indicates the charge status "zero".

In a device of the type initially referred to using a voltage discriminator detecting a predetermined voltage on the battery, this object is accomplished in that the voltage discriminator activates a time measurement means on sensing the predetermined voltage on the battery, the time measurement means controlling the display means and disconnecting the electrical load from the battery by means of the electronic switching device following expiration of a predetermined time period, when the display means indicates the charge status "zero".

When the electrical load is a direct-current motor, an advantageous embodiment of the present invention consists in that the time measurement means, following expiration of the predetermined time period, drives a pulse-duration modulator reducing the pulse duty factor of the control voltage for the electronic switching device, so that the rotational frequency of the motor is reduced in steps or continually down to zero, thereby preventing the motor from stopping abruptly which would be awkward in an electric shaver or hair clipper, for example, because of the risk of hair being snagged.

Further advantageous embodiments will become apparent from the other subclaims and the description.

Embodiments of the present invention will now be described in more detail in the following with reference to the accompanying drawings.

Figure 1:
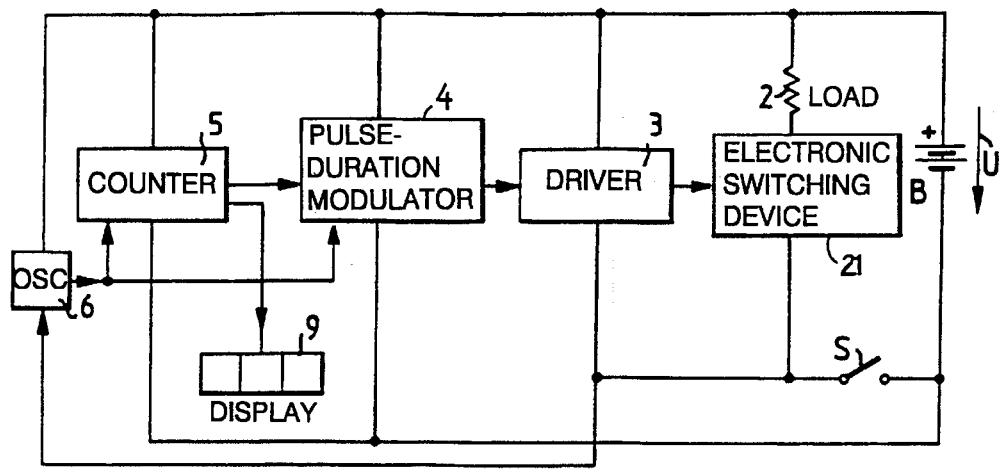
FIG. 1 is a block diagram.

Referring now to FIG. 1 of the drawings, a load 2 is connected to a battery (accumulator) B by means of an On/Off switch S and an electronic switching device 21. The battery B can be recharged by means of a charging circuit not shown. The electronic switching device 21 is driven by a pulse-duration modulator 4 via a driver circuit 3.

A counter 5 records the time period during which the load L, which has an essentially constant power consumption, is connected to the battery B via the switch S, the count starting from a fully charged condition of the battery.

The rated capacity of the battery B being also known, a display means 9 indicating the charge status of the battery is controlled by the counter 5 on a time basis. After a predetermined connection time has elapsed which is determined on the basis of the known power consumption and the known rated capacity of the battery B, such that the battery then contains a low residual charge only, the counter 5 will deliver an output signal. At this point, the display means 9 will indicate the charge status "zero". This signal will cause the electronic switching device 21 to be driven. Driving may be accomplished by a pulse-duration modulator 4 which gradually reduces the pulse duty factor of the control voltage down to zero, thus also gradually reducing the current flowing through the load 2. An oscillator 6 provides the clock pulses for the counter 5 and the pulse-duration modulator 4.

Figure 2:
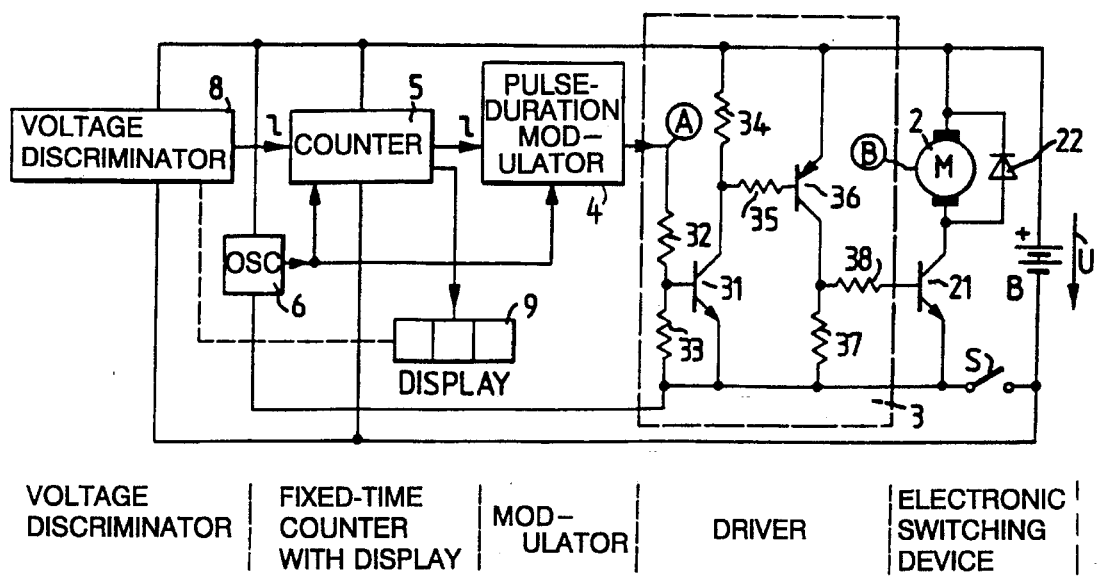
FIG. 2 is a block diagram showing an embodiment in which the electrical load is a motor.

In FIG. 2, the load 2 is a direct-current motor M of an electric shaving apparatus, for example. The series arrangement comprising the motor M and the switching transistor 21 is applied to the battery B via the On/Off switch S when the device is set in operation. A diode 22 connected in parallel with the motor M prevents inductive voltage peaks. The base of the switching transistor 21 is driven by the output of the pulse-duration modulator 4 via a driver circuit 3 comprised of transistors 31, 36 and resistors 32, 33, 34, 35, 37, 38.

Connected directly in parallel with the battery B, that is, bypassing the On/Off switch S, are a voltage discriminator 8 and the counter 5. The voltage discriminator 8 detects a predetermined voltage U on the battery B. This detected voltage U is, for example, the "low charge" level, that is, a voltage level U residing at the battery when the battery contains only 10% to 20% of its full charge. Until this low-charge level is reached, the display means 9 will indicate the charge status resulting from the preceding time period during which the motor M has been connected to the battery B.

When the voltage discriminator 8 has detected the low-charge level of the voltage U on the battery B, the counter 5 and a second indicating unit of the display means 9 will be started. When the detected low-charge level is attained, the motor has, for example, only eight minutes of operation left until the battery B is completely depleted. The time period predetermined for the counter 5 is then six minutes, for example, in order to preclude complete discharging of the battery. This period of six minutes may be subdivided into six fixed time intervals of equal length, so that each minute one segment of the second indicating unit of the display means 9 is driven. These segments may also indicate the minutes remaining until expiration of the predetermined time period. After the predetermined time (six minutes) has elapsed, that is, when the counter 5 has reached zero, the pulse-duration modulator 4 will be driven.

Figure 3:
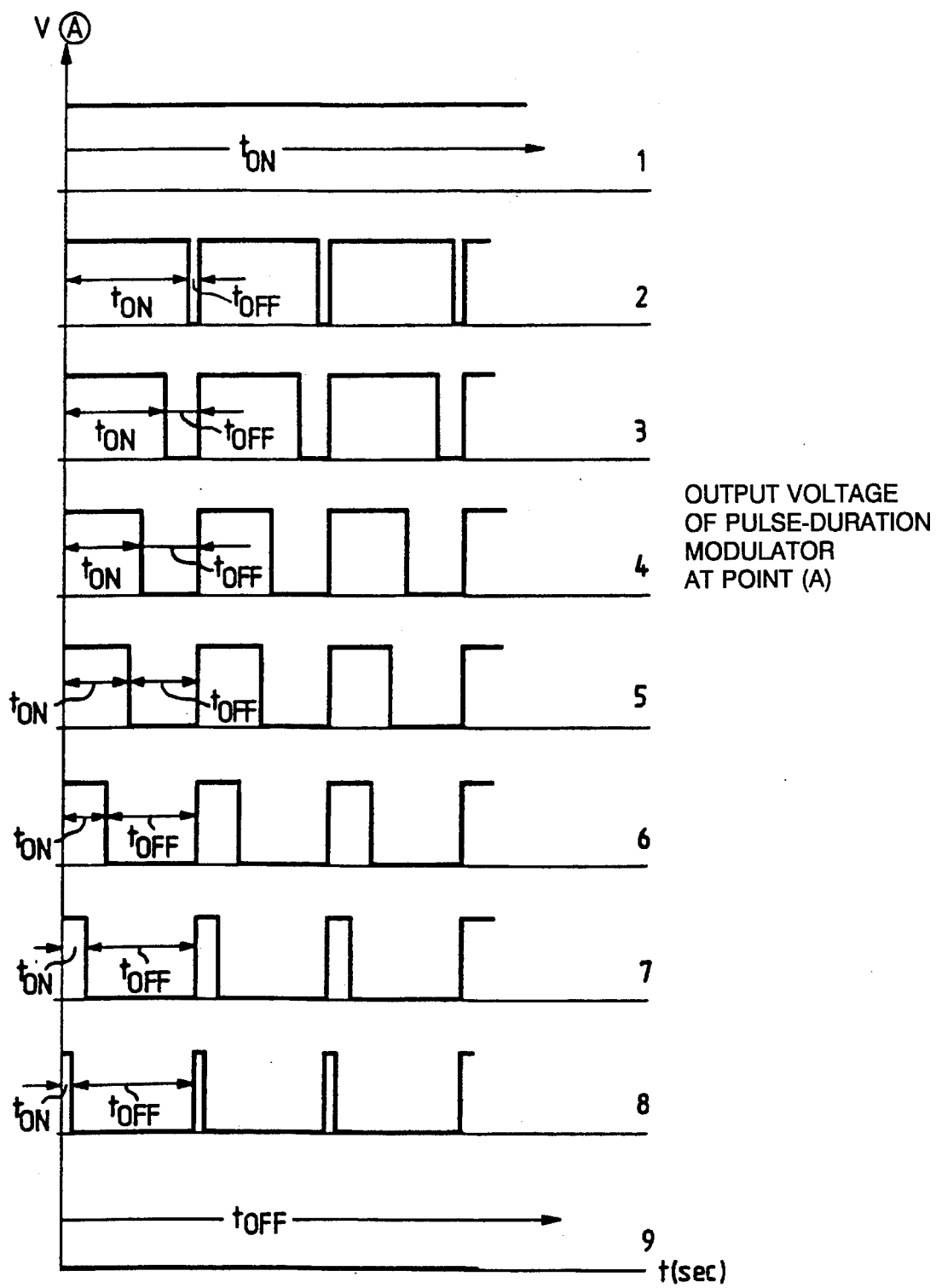
FIG. 3 is a graph showing an output signal of the pulse-duration modulator of FIG. 2, when the rotational frequency of the motor is reduced in conformity with a drop in battery voltage.
Figure 4:
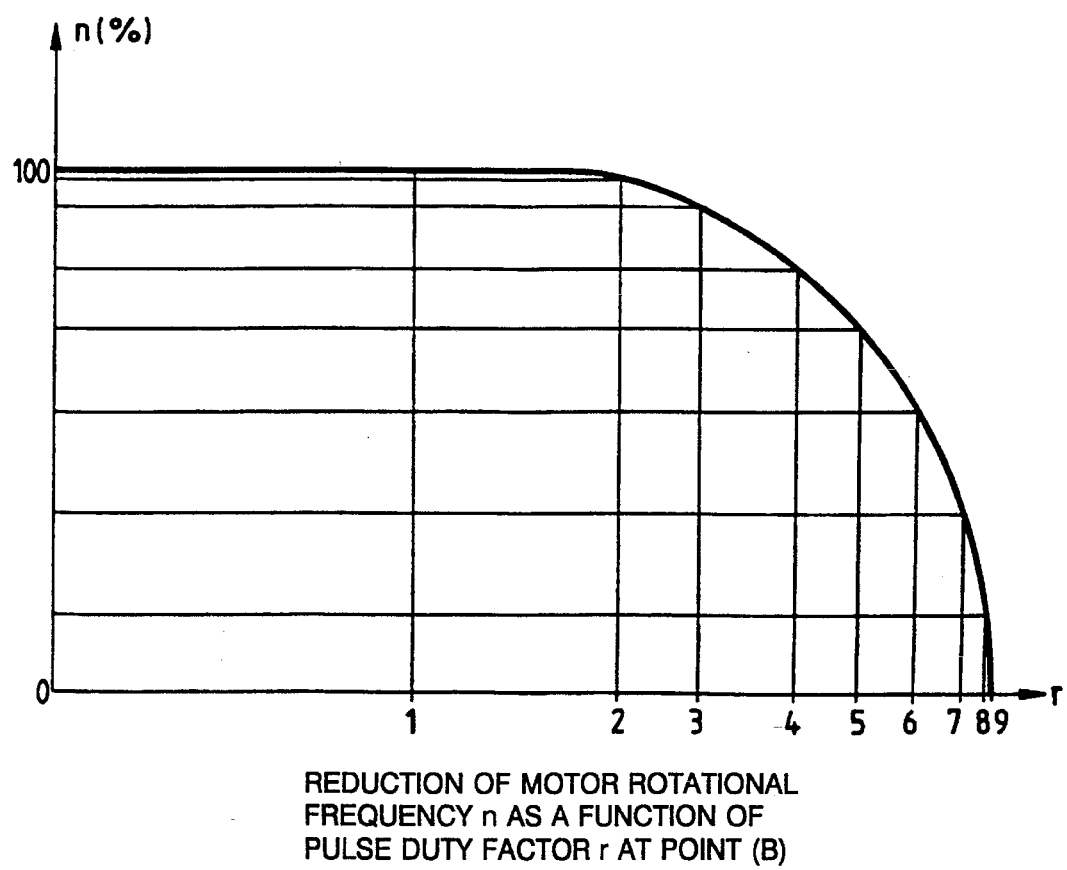
FIG. 4 is a graph showing the rotational frequency of the motor as a function of the pulse duty factor of the pulse-duration modulator of FIG. 3.

This pulse-duration modulator 4 then reduces the pulse duration factor of the control voltage supplied to the driver circuit 3 in a manner shown in FIG. 3 by way of example. The individual pulse duty factors of FIG. 3 are assigned numerals from 1 (full control voltage) through 9 (control voltage zero). FIG. 4 illustrates the rotational frequency (in % of the rated speed) plotted against these pulse duty factors, with the pulse duty factors assigned numerals 1 to 9 corresponding to those shown in FIG. 3. The curve corresponds essentially to the voltage curve of a battery with the load switched on until it is completely discharged.

In this manner, deep discharging of the battery is avoided. Because an abrupt standstill of the motor is prevented from occurring, hair cannot be painfully snagged in a shaver or hair clipper by accident.

We claim:

1. Electrical device such as an electrical shaver or hair cutter comprising a DC motor adapted to be driven by a battery, an electronic switching device, and time measurement means for evaluating the time when said DC motor is connected to said battery, said electronic switching device, in response to said time measurement means indicating that a defined connecting time of said DC motor to said battery has elapsed, gradually reducing a current supplied to said DC motor so that a rotational frequency of said motor is reduced in steps or continually down to zero prior to deep discharge of said battery to limit risk that hairs could be snagged.

2. Electrical device such as an electrical shaver or hair cutter comprising a DC motor adapted to be driven by a battery, an electronic switching device, a voltage discriminator for detecting a predetermined voltage on said battery, and time measurement means which is started if the battery has the predetermined voltage, said electronic switching device, in response to said time measurement means indicating that a defined time has elapsed gradually reducing a current supplied to said DC motor, so that a rotational frequency of said motor is reduced in steps or continually down to zero prior to deep discharge of said battery to limit risk of hairs being snagged.

3. The electrical device as claimed in claim 1 or 2, and further including a pulse duration modulator, and wherein said time measurement means, following the expiration of a predetermined time period, drives said pulse duration modulator for reducing a pulse duty factor of the control voltage for said electronic switching device, so that the rotational frequency of said motor is reduced in steps or continually down to zero.

4. An electrical device as claimed in claim 3 wherein the rotational frequency of said motor is reduced similarly to a curve of a falling battery voltage shortly before deep depletion.

5. An electrical device as claimed in claim 1 or claim 2 wherein said time measurement means is a fixed-time counter pulsed by an oscillator.

6. The electrical device as claimed in claim 5 and further including a pulse duration modulator, and wherein said time measurement means, following the expiration of a predetermined time period, drives said pulse duration modulator for reducing the pulse duty factor of the control voltage for said electronic switching device, so that the rotational frequency of said motor is reduced in steps or continually down to zero.

7. An electrical device as claimed in claim 6, further comprising a microprocessor including said fixed-time counter, said oscillator, and said pulse-duration modulator.

8. An electrical device as claimed in claim 5 wherein said fixed-time counter is subdivided into fixed time intervals indicated by a display means.

9. An electrical device as claimed in claim 3 and further including circuitry operative on activation of said time measurement means for correcting a display means in the event of non-agreement of a charge status indicated by said display means with a detected charge status of said battery.

10. An electrical device as claimed in claim 9 wherein said display means further comprises an indicating unit showing the minutes remaining until expiration of said predetermined time period.

11. An electrical device as claimed in claim 2 and further including circuitry connecting said voltage discriminator and said time measurement means directly in parallel with said battery, and circuitry including an On/Off switch for connecting a series arrangement comprising said motor and said electronic switching device to said battery by means of said On/Off switch.

12. The electrical device as claimed in claim 1 or 2, and further including a display showing a charge condition of said battery.

* * * * *

UNITED STATES PATENT AND TRADEMARK OFFICE
CERTIFICATE OF CORRECTION

PATENT NO. : 5,623,193
DATED      : April 22, 1997
INVENTOR(S): Gerhard Lang, Jürgen Wolf It is certified that error appears in the above-identified patent and that said Letters Patent is hereby corrected as shown below:

Title page, item

[56] Under "U.S. PATENT DOCUMENTS", please insert the following:

```
--4,380,726    4/1983   Sado et al.                320/48--
--4,703,247   10/1987   Morioka                    320/13--
--4,835,453    5/1989   Munning Schmidt et al.     320/13--
```

Under "FOREIGN PATENT DOCUMENTS", please insert the following:

--0 240 883  10/1987  Europe--.

Signed and Sealed this

Thirteenth Day of April, 1999

Attest:

Q. TODD DICKINSON

*Attesting Officer*     *Acting Commissioner of Patents and Trademarks*